United States Patent
Yuan et al.

(10) Patent No.: US 10,733,949 B2
(45) Date of Patent: Aug. 4, 2020

(54) GOA CIRCUIT, ARRAY SUBSTRATE AND DISPLAY DEVICE

(71) Applicant: SHENZHEN ROYOLE TECHNOLOGIES CO., LTD., Shenzhen, Guangdong (CN)

(72) Inventors: Ze Yuan, Guangdong (CN); Ximeng Guan, Guangdong (CN); Jigang Zhao, Guangdong (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/334,971

(22) PCT Filed: Dec. 15, 2016

(86) PCT No.: PCT/CN2016/110146
§ 371 (c)(1),
(2) Date: Mar. 20, 2019

(87) PCT Pub. No.: WO2018/107440
PCT Pub. Date: Jun. 21, 2018

(65) Prior Publication Data
US 2020/0020292 A1    Jan. 16, 2020

(51) Int. Cl.
G09G 3/36       (2006.01)
G02F 1/1345     (2006.01)
G09G 3/3266     (2016.01)

(52) U.S. Cl.
CPC ....... *G09G 3/3677* (2013.01); *G02F 1/13454* (2013.01); *G09G 3/3266* (2013.01); *G09G 2310/0264* (2013.01)

(58) Field of Classification Search
CPC combination set(s) only.
See application file for complete search history.

(56) References Cited

U.S. PATENT DOCUMENTS 9,589,664 B2    3/2017  Lou
2011/0273417 A1*  11/2011  Shin .................. G09G 3/20
                                                345/211

(Continued)

FOREIGN PATENT DOCUMENTS

CN    101937718 A    1/2011
CN    102237031 A    11/2011

(Continued)

OTHER PUBLICATIONS

International Search Report dated Jul. 12, 2017 for corresponding International Application No. PCT/CN2016/110146, filed Dec. 15, 2016.

(Continued)

*Primary Examiner* — Van N Chow
(74) *Attorney, Agent, or Firm* — IPro, PLLC

(57) ABSTRACT

Provided are a gate driver on array (GOA) circuit, an array substrate, and a display device. The GOA circuit provides a scanning pulse signal to a pixel matrix and includes cascaded GOA units. The GOA unit includes first and second enable input terminals, first and second output terminals, and a first node. The first output terminal of an N−2-level GOA unit is connected to the first enable input terminal of an N-level GOA unit, and the second output terminal of the N−2-level GOA unit is connected to the second enable input terminal of an N−1-level GOA unit, N being greater than 2. The second output terminal outputs a scanning pulse signal to the pixel matrix. The GOA unit further includes a pull-up unit connected to the second enable input terminal and the first node to charge the first node to a first given voltage.

20 Claims, 13 Drawing Sheets

(56) References Cited

U.S. PATENT DOCUMENTS

| | | |
|---|---|---|
| 2015/0042638 A1 | 2/2015 | Kwon et al. |
| 2016/0189794 A1* | 6/2016 | Lou ........................ G11C 19/28 |
| | | 345/214 |
| 2016/0322115 A1 | 11/2016 | Xu et al. |

FOREIGN PATENT DOCUMENTS

| | | |
|---|---|---|
| CN | 104505046 A | 4/2015 |
| CN | 104766586 A | 7/2015 |
| CN | 105336300 A | 2/2016 |

OTHER PUBLICATIONS

Written Opinion of the International Searching Authority dated Jul. 12, 2017 for corresponding International Application No. PCT/CN2016/110146, filed Dec. 15, 2016.

* cited by examiner

GOA CIRCUIT, ARRAY SUBSTRATE AND DISPLAY DEVICE

CROSS-REFERENCE TO RELATED APPLICATIONS

This application is a national phase application of International Application No. PCT/CN2016/110146, filed Dec. 15, 2016, the entire contents of which are incorporated herein by reference.

FIELD

The present disclosure relates to a display field, and more particularly to a gate driver on array (GOA) circuit, an array substrate and a display device.

BACKGROUND

In recent years, a gate driver on array (GOA) circuit has been widely used in electronic displayers such as a liquid crystal display (LCD) and an active-matrix organic light emitting diode (AMOLED). The GOA circuit is a key part of the display panel and is configured to provide a scanning pulse signal to a pixel matrix. The GOA circuit is typically designed in cascade. However, conventional cascading form is very easily influenced by a fault of just one single level circuit caused by random events, such as a transistor leakage, a short circuit, or an open circuit, happened in the process, such as. In a GOA circuit in such a cascading form, if there is an error in just one level, the error will transmit in the GOA link, resulting in output failures in all the subsequent levels.

SUMMARY

Embodiments of the present disclosure seek to solve at least one of the problems existing in the related art to at least some extent. Accordingly, embodiments of the present disclosure provide a GOA circuit, an array substrate and a display device.

Embodiments of the present disclosure provide a GOA circuit, configured to provide a scanning pulse signal to a pixel matrix, including a plurality of GOA units in cascade, in which the GOA unit includes a first enable input terminal, a second enable input terminal, a first output terminal, a second output terminal and a first node, a first output terminal of a GOA unit of a $(N-2)^{th}$ level is coupled to a first enable input terminal of a GOA unit of a $N^{th}$ level, a second output terminal of the GOA unit of the $(N-2)^{th}$ level is coupled to a second enable input terminal of a GOA unit of a $(N-1)^{th}$ level, in which N is a natural number greater than 2, and the second output terminal is configured to output the scanning pulse signal to the pixel matrix;

the GOA unit further includes a pull-up holding unit configured to couple the second enable input terminal to the first node and charge the first node to hold a voltage of the first node at a first preset voltage.

In the GOA circuit described above, the GOA unit of the $(N-2)^{th}$ level and the GOA unit of the $(N-1)^{th}$ level may both charge the first node PU of the $N^{th}$ level. When output failure occurs in one of the GOA units of the adjacent two levels, the first node PU of the $N^{th}$ level can still be charged, such that the GOA circuit remains in a normal working state, and the reliability of the circuit is improved.

In some embodiments of the present disclosure, the pixel matrix includes a plurality of rows of pixels, and a second output terminal of a GOA unit of a current level is configured to output the scanning pulse signal to a corresponding row of pixels in the pixel matrix, and the corresponding row of pixels are coupled to a second enable input terminal of a GOA unit of a subsequent level.

In some embodiments of the present disclosure, GOA units of two adjacent levels are disposed at two sides of the pixel matrix, respectively.

In some embodiments of the present disclosure, the pull-up holding unit includes a fourth transistor, a gate and a source of the fourth transistor are coupled to the second enable input terminal and a drain of the fourth transistor is coupled to the first node.

In some embodiments of the present disclosure, the GOA unit includes a pull-down unit, a pull-up controlling unit, a bootstrap capacitor, a pull-up unit, a second node and a third node, a first clock signal terminal, a second clock signal terminal, a reset terminal and a low level terminal, in which the pull-down unit is coupled to the first node, the reset terminal and the low level terminal, and configured to discharge the first node to clamp the voltage of the first node at a second preset voltage smaller than the first present voltage;

the pull-up controlling unit is coupled to the first enable input terminal and the first node, and configured to charge the first node to increase the voltage of the first node to the first preset voltage;

one terminal of the bootstrap capacitor is coupled to the first node and the other terminal of the bootstrap capacitor is coupled to the first output terminal; and the pull-up unit is coupled to the first clock signal terminal, the second clock signal terminal, the first node, the low level terminal, the first output terminal and the second output terminal, and configured to discharge the second node and the third node to turn off the pull-down unit.

In some embodiments of the present disclosure, the pull-down unit includes a second transistor, a tenth transistor, an eleventh transistor, a twelfth transistor, a fourteenth transistor, in which a gate of the second transistor is coupled to the reset terminal, a source of the second transistor is coupled to the first node, and a drain of the second transistor is coupled to the low level terminal;

a gate of the tenth transistor is coupled to the third node, a source of the tenth transistor is coupled to the first node, and a drain of the tenth transistor is coupled to the low level terminal;

a gate of the eleventh transistor is coupled to the third node, a source of the eleventh transistor is coupled to the second output terminal, and a drain of the eleventh transistor is coupled to the low level terminal;

a gate of the twelfth transistor is coupled to the reset terminal, a source of the twelfth transistor is coupled to the second output terminal, and a drain of the twelfth transistor is coupled to the low level terminal; and a gate of the fourteenth transistor is coupled to the third node, a source of the fourteenth transistor is coupled to the first output terminal, and a drain of the fourteenth transistor is coupled to the low level terminal.

In some embodiments of the present disclosure, the pull-up controlling unit includes a first transistor, a gate and a source of the first transistor are coupled to the first enable input terminal, and a drain of the first transistor is coupled to the first node.

In some embodiments of the present disclosure, the pull-up unit includes a third transistor, a fifth transistor, a sixth transistor, a seventh transistor, an eighth transistor, a ninth transistor and a thirteenth transistor, in which a gate of the third transistor is coupled to the first node, a source of the third transistor is coupled to the second clock signal terminal, and a drain of the third transistor is coupled to the first output terminal;

a gate of the fifth transistor is coupled to the second node, a source of the fifth transistor is coupled to the second clock signal terminal, and a drain of the fifth transistor is coupled to the third node;

a gate of the sixth transistor is coupled to the first node, a source of the sixth transistor is coupled to the third node, and a drain of the sixth transistor is coupled to the low level terminal;

a gate of the seventh transistor is coupled to the first clock signal terminal, a source of the seventh transistor is coupled to the third node, and a drain of the seventh transistor is coupled to the low level terminal;

a gate of the eighth transistor is coupled to the first clock signal terminal, a source of the eighth transistor is coupled to the second node, and a drain of the eighth transistor is coupled to the low level terminal;

a gate and a source of the ninth transistor are coupled to the second clock signal terminal, and a drain of the ninth transistor is coupled to the second node; and a gate of the thirteenth transistor is coupled to the first node, a source of the thirteenth transistor is coupled to the second clock signal terminal, and a drain of the thirteenth transistor is coupled to the second output terminal.

In some embodiments of the present disclosure, a first enable input terminal of a GOA unit of a first level is configured to receive a first starting signal, and a first enable input terminal of a GOA unit of a second level is configured to receive a second starting signal, the first starting signal is configured to activate the GOA unit of the first level, and the second starting signal is configured to activate the GOA unit of the second level.

In some embodiments of the present disclosure, a phase difference between the first clock signal terminal and the second clock signal terminal is half of a cycle.

In some embodiments of the present disclosure, a first clock signal terminal of the GOA unit of the $(N-2)^{th}$ level and a second clock signal terminal of the GOA unit of the $N^{th}$ level are configured to receive the first clock signal, a second clock signal terminal of the GOA unit of the $(N-2)^{th}$ level and a first clock signal terminal of the GOA unit of the $N^{th}$ level are configured to receive a third clock signal, a first clock signal terminal of the GOA unit of the $(N-1)^{th}$ level and a second clock signal terminal of a GOA unit of a $(N+1)^{th}$ level are configured to receive a second clock signal, a second clock signal terminal of the GOA unit of the $(N-1)^{th}$ level and a first clock signal terminal of the GOA unit of the $(N+1)^{th}$ level are configured to receive a fourth clock signal.

In some embodiments of the present disclosure, the first clock signal, the second clock signal, the third clock signal and the fourth clock signal each have a duty cycle less than or equal to 25%.

Embodiments of the present disclosure provide an array substrate, including a pixel matrix and a GOA circuit described above.

In the array substrate, the GOA unit of the $N^{th}$ level and the GOA unit of the $(N+1)^{th}$ level may both charge the first node PU of the $(N+2)^{th}$ level. When output failure occurs in one of the GOA units of the adjacent two levels, the first node PU of the $(N+2)^{th}$ level can still be charged, such that the GOA circuit remains in a normal working state, and the reliability of the circuit is improved.

Embodiments of the present disclosure provide a display device including an array substrate described above.

In the array substrate, the GOA unit of the $(N-2)^{th}$ level and the GOA unit of the $(N-1)^{th}$ level may both charge the first node PU of the $N^{th}$ level. When output failure occurs in one of the GOA units of the adjacent two levels, the first node PU of the $N^{th}$ level can still be charged, such that the GOA circuit remains in a normal working state, and the reliability of the circuit is improved.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the drawings, in which.

REFERENCE NUMERALS

Figure 1:
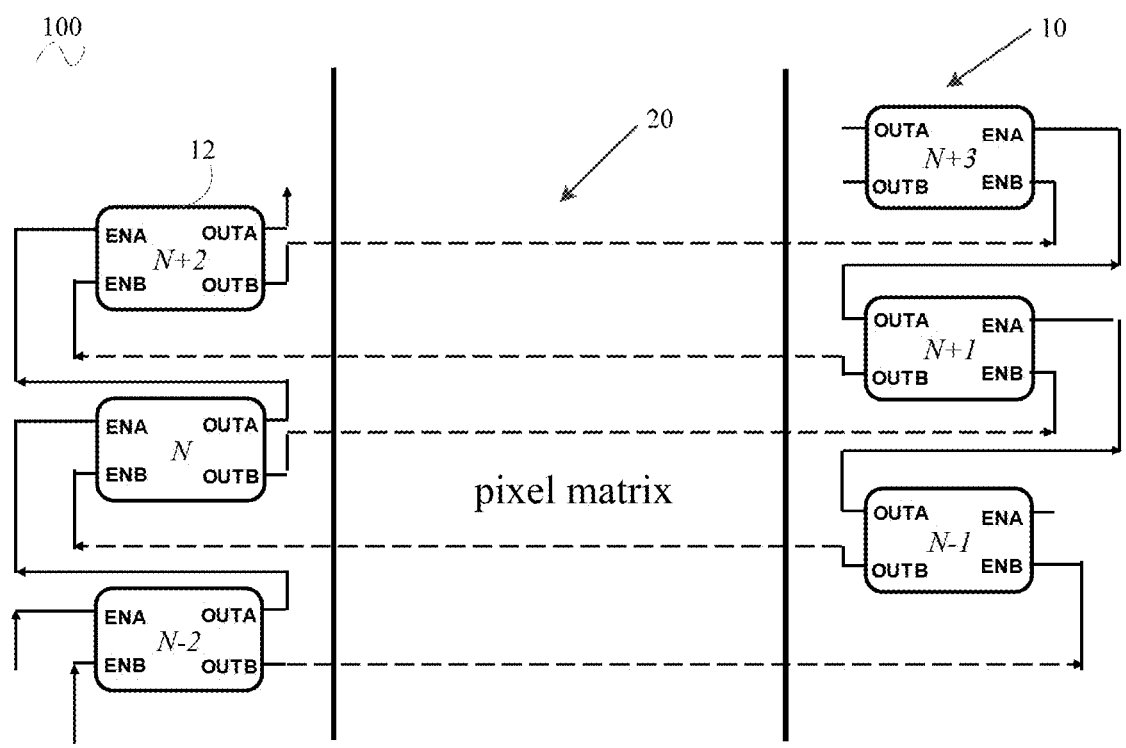
FIG. 1 is a schematic structural diagram of an array substrate according to an embodiment of the present disclosure.
Figure 2:
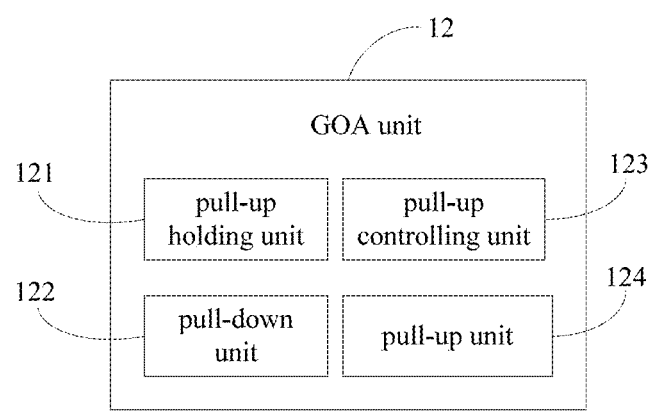
FIG. 2 is a functional block diagram of a GOA unit according to an embodiment of the present disclosure.

GOA circuit 10, GOA unit 12, pull-up holding unit 121, pull-down unit 122, pull-up controlling unit 123, pull-up unit 124, bootstrap capacitor C, first transistor M1, second transistor M2, third transistor M3, fourth transistor M4, fifth transistor M5, sixth transistor M6, seventh transistor M7, eighth transistor M8, ninth transistor M9, tenth transistor M10, eleventh transistor M11, twelfth transistor M12, thirteenth transistor M13, fourteenth transistor M14, first enable input terminal ENA, second enable input terminal ENB, first clock signal terminal CLK, second clock signal terminal CLKB, first output terminal OUTA, second output terminal OUTB, reset terminal CLKRST, first clock signal CK1, second clock signal CK2, third clock signal CK3, fourth clock signal CK4, first starting signal STV1, second starting signal STV2, low level terminal VGL, first node PU, second node PD1, third node PD;

pixel matrix 20;
array substrate 100;
display device 1000.

DETAILED DESCRIPTION

Reference will be made in detail to embodiments of the present disclosure. The same or similar elements and the elements having same or similar functions are denoted by like reference numerals throughout the descriptions. The embodiments described herein with reference to drawings are explanatory, and used to generally understand the present disclosure. The embodiments shall not be construed to limit the present disclosure.

In the specification, it is to be understood that terms such as "central", "longitudinal", "lateral", "length", "width", "thickness", "upper", "lower", "front", "rear", "left", "right", "vertical", "horizontal", "top", "bottom", "inner", "outer", "clockwise" and "counterclockwise" should be construed to refer to the orientation as then described or as shown in the drawings under discussion. These relative terms are for convenience of description and do not require that the present disclosure be constructed or operated in a particular orientation. In addition, terms such as "first" and "second" are used herein for purposes of description and are not intended to indicate or imply relative importance or significance or to imply the number of indicated technical features. Thus, the feature defined with "first" and "second" may include one or more of this feature. In the description of the present disclosure, unless specified otherwise, "a plurality of" means two or more than two.

In the present disclosure, unless specified or limited otherwise, the terms "mounted", "connected", "coupled" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed there between. Furthermore, a first feature "on", "above" or "on top of" a second feature may include an embodiment in which the first feature is right or obliquely "on", "above" or "on top of" the second feature, or just means that the first feature is at a height higher than that of the second feature; while a first feature "below", "under" or "on bottom of" a second feature may include an embodiment in which the first feature is right or obliquely "below", "under" or "on bottom of" the second feature, or just means that the first feature is at a height lower than that of the second feature.

Various embodiments and examples are provided in the following description to implement different structures of the present disclosure. In order to simplify the present disclosure, certain elements and settings will be described. However, these elements and settings are only by way of example and are not intended to limit the present disclosure. In addition, reference numerals may be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied.

Transistors used in all embodiments of the present disclosure may be a field effect transistor, and more specifically may be a thin film transistor (TFT). Since a source and a drain of the transistor used herein are symmetrical, they may be used interchangeably. In order to distinguish the two poles other than the gate of the field effect transistor, it may be determined that an upper end of the field effect transistor is defined as the source, a middle end is defined as the gate, and a lower end is defined as the drain as shown in the drawings.

Figure 3:
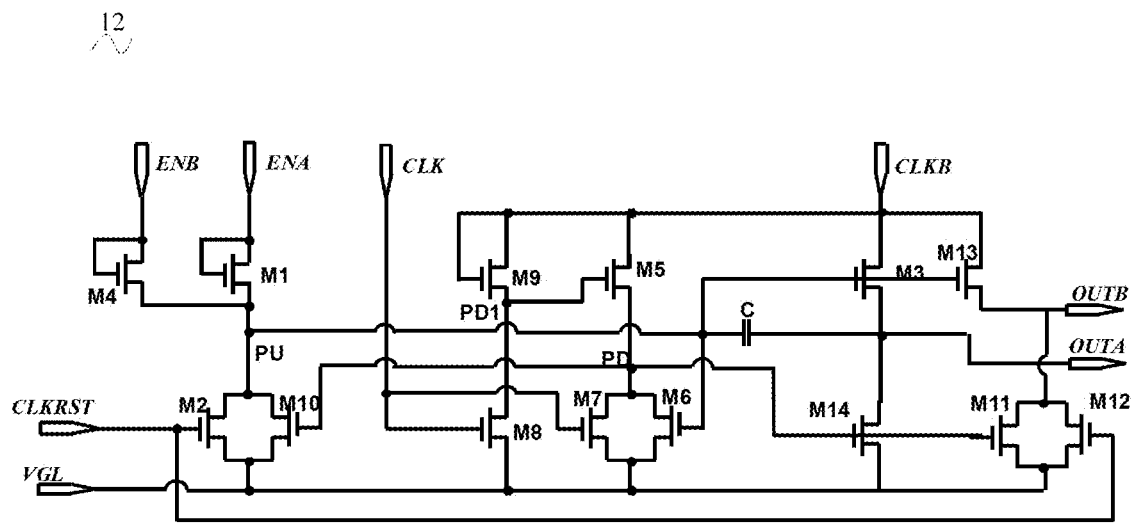
FIG. 3 is a schematic circuit diagram of a GOA unit according to an embodiment of the present disclosure.

With reference to FIGS. 1 and 3, in an embodiment of the present disclosure, a GOA circuit 10 is configured to provide a scanning pulse signal to a pixel matrix 20, and includes a plurality of GOA units 12 in cascade. The GOA unit 12 includes a first enable input terminal ENA, a second enable input terminal ENB, a first output terminal OUTA, a second output terminal OUTB and a first node PU. A first output terminal OUTA of a GOA unit 12 of a $(N-2)^{th}$ level is coupled to a first enable input terminal ENA of a GOA unit 12 of a $N^{th}$ level, a second output terminal OUTB of the GOA unit 12 of the $(N-2)^{th}$ level is coupled to a second enable input terminal ENB of a GOA unit 12 of a $(N-1)^{th}$ level, in which N is a natural number greater than 2. The second output terminal OUTB is configured to output the scanning pulse signal to the pixel matrix 20. The GOA unit 12 further includes a pull-up holding unit 121 configured to couple the second enable input terminal ENB to the first node PU and charge the first node PU to hold a voltage of the first node PU at a first preset voltage VGH.

In the GOA circuit 10 described above, the GOA unit 12 of the $(N-2)^{th}$ level and the GOA unit 12 of the $(N-1)^{th}$ level may both charge the first node PU of the $N^{th}$ level. When output failure occurs in one of the GOA units 12 of the adjacent two levels, the first node PU of the $N^{th}$ level can still be charged, such that the GOA circuit 10 remains in a normal working state, and the reliability of the circuit is improved.

In the case that the first node PU is normally charged, the voltage of the first node PU will be further increased to (2VGH-VGL) during bootstrap output of the GOA unit 12, such that the second output terminal OUTB outputs the first preset voltage VGH, and thus may normally provide a scanning pulse signal to the pixel matrix 20, in which, VGL is the second preset voltage. The first preset voltage VGH may be a high level voltage, and the second preset voltage VGL may be a low level voltage.

In an embodiment, the array substrate 100 of the present disclosure includes a pixel matrix 20 and a GOA circuit 10.

Figure 4:
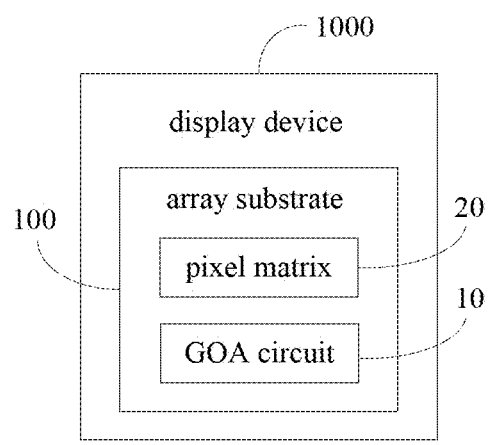
FIG. 4 is a block diagram of a display device according to an embodiment of the present disclosure.

As shown in FIG. 4, the array substrate 100 according to embodiments of the present disclosure may be used for the display device 1000 of the present disclosure.

In some embodiments, the display device may be an electronic display device such as LCD and an AMOLED.

In some embodiments, the pixel matrix 20 includes a plurality of rows of pixels (not shown). A second output terminal OUTB of a GOA unit 12 of the current level is configured to output the scanning pulse signal to a corresponding row of pixels (not shown) in the pixel matrix 20, and the corresponding row of pixels (not shown) are coupled to a second enable input terminal ENB of a GOA unit 12 of a subsequent level.

In some embodiments, the GOA units 12 of two adjacent levels are disposed at two sides of the pixel matrix 20, respectively.

In this way, a probability that the GOA units 12 of the two adjacent levels simultaneously have an output failure is greatly reduced.

In some embodiments, the pull-up holding unit 121 includes a fourth transistor M4. A gate and a source of the fourth transistor M4 are coupled to the second enable input terminal ENB, and a drain of the fourth transistor M4 is coupled to the first node PU.

In this way, even if the first node PU is discharged after being pre-charged, the fourth transistor M4 may be able to boost the voltage of the first node PU back to the first preset voltage VGH in the subsequent holding stage.

In some embodiments, the GOA unit 12 includes a pull-down unit 122, a pull-up controlling unit 123, a bootstrap capacitor C, a pull-up unit 124, a second node PD1 and a third node PD, a first clock signal terminal CLK, a second clock signal terminal CLKB, a reset terminal CLKRST and a low level terminal VGL. The pull-down unit 122 is coupled to the first node PU, the second clock signal terminal CLKB and the low level terminal VGL. The pull-down unit 122 is configured to discharge the first node PU to clamp the voltage of the first node Pu at a second preset voltage VGL smaller than the first present voltage VGH. The pull-up controlling unit 123 is coupled to the first enable input terminal ENA and the first node PU and is configured to charge the first node PU to increase the voltage of the first node PU to the first preset voltage VGH. One terminal of the bootstrap capacitor C is coupled to the first node PU and the other terminal of the bootstrap capacitor C is coupled to the first output terminal OUTA. The pull-up unit 124 is coupled to the first clock signal terminal CLK, the second clock signal terminal CLKB, the first node PU, the low level terminal VGL, the first output terminal OUTA and the second output terminal OUTB, and is configured to discharge the second node PD1 and the third node PD to turn off the pull-down unit 122.

It should be understood that the bootstrap capacitor C is configured to increase the voltage of the first node PU for a second time.

In some embodiments, the pull-down unit 122 includes a second transistor M2, a tenth transistor M10, an eleventh transistor M11, a twelfth transistor M12, a fourteenth transistor M14. A gate of the second transistor M2 is coupled to the reset terminal CLKRST, a source of the second transistor M2 is coupled to the first node PU, and a drain of the second transistor M2 is coupled to the low level terminal VGL. A gate of the tenth transistor M10 is coupled to the third node PD, a source of the tenth transistor M10 is coupled to the first node PU, and a drain of the tenth transistor M10 is coupled to the low level terminal VGL. A gate of the eleventh transistor M11 is coupled to the third node PD, a source of the eleventh transistor M11 is coupled to the second output terminal OUTB, and a drain of the eleventh transistor M11 is coupled to the low level terminal VGL. A gate of the twelfth transistor M12 is coupled to the reset terminal CLKRST, a source of the twelfth transistor M12 is coupled to the second output terminal OUTB, and a drain of the twelfth transistor M12 is coupled to the low level terminal VGL. A gate of the fourteenth transistor M14 is coupled to the third node PD, a source of the fourteenth transistor M14 is coupled to the first output terminal OUTA, and a drain of the fourteenth transistor M14 is coupled to the low level terminal VGL.

It should be understood that the pull-down unit 122 may be configured to discharge the residual charges on the first node PU and a node of the second output terminal OUTB, and clamp voltages of the two nodes at the second preset voltage VGL.

In some embodiments, the pull-up controlling unit 123 includes a first transistor M1, a gate and a source of the first transistor M1 are coupled to the first enable input terminal ENA, and a drain of the first transistor M1 is coupled to the first node PU.

In some embodiments, the pull-up unit 124 includes a third transistor M3, a fifth transistor M5, a sixth transistor M6, a seventh transistor M7, an eighth transistor M8, a ninth transistor M9 and a thirteenth transistor M13. A gate of the third transistor M3 is coupled to the first node PU, a source of the third transistor M3 is coupled to the second clock signal terminal CLKB, and a drain of the third transistor M3 is coupled to the first output terminal OUTA. A gate of the fifth transistor M5 is coupled to the second node PD1, a source of the fifth transistor M5 is coupled to the second clock signal terminal CLKB, and a drain of the fifth transistor M5 is coupled to the third node PD. A gate of the sixth transistor M6 is coupled to the first node PU, a source of the sixth transistor M6 is coupled to the third node PD, and a drain of the sixth transistor M6 is coupled to the low level terminal VGL. A gate of the seventh transistor M7 is coupled to the first clock signal terminal CLK, a source of the seventh transistor M7 is coupled to the third node PD, and a drain of the seventh transistor M7 is coupled to the low level terminal VGL. A gate of the eighth transistor M8 is coupled to the first clock signal terminal CLK, a source of the eighth transistor M8 is coupled to the second node PD1, and a drain of the eighth transistor M8 is coupled to the low level terminal VGL. A gate and a source of the ninth transistor M9 are coupled to the second clock signal terminal CLKB, and a drain of the ninth transistor M9 is coupled to the second node PD1. A gate of the thirteenth transistor M13 is coupled to the first node Pu, a source of the thirteenth transistor M13 is coupled to the second clock signal terminal CLKB, and a drain of the thirteenth transistor M13 is coupled to the second output terminal OUTB.

Figure 5:
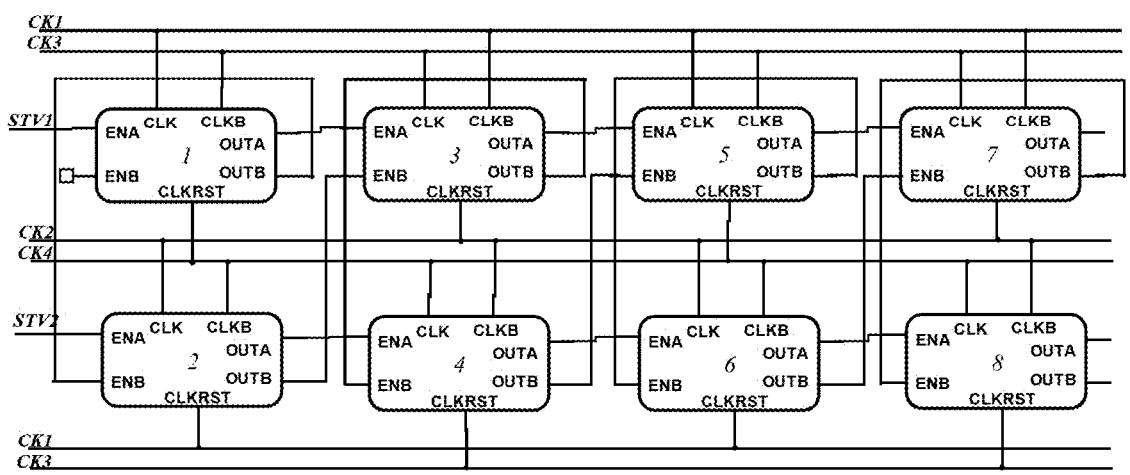
FIG. 5 is a schematic diagram of a GOA circuit in cascade according to an embodiment of the present disclosure.

As shown in FIG. 5, in some embodiments, a first enable input terminal ENA of a GOA unit 12 of a first level is configured to receive a first starting signal STV1. A first enable input terminal ENA of a GOA unit 12 of a second level is configured to receive a second starting signal STV2. The first starting signal STV1 is configured to activate the GOA unit 12 of the first level, and the second starting signal STV2 is configured to activate the GOA unit 12 of the second level.

In some embodiments, a phase difference between the first clock signal terminal CLK and the second clock signal terminal CLKB is half of a cycle.

In some embodiments, a first clock signal terminal CLK of the GOA unit 12 of the $(N-2)^{th}$ level and a second clock signal terminal CLKB of the GOA unit 12 of the $N^{th}$ level are configured to receive the first clock signal CK1, a second clock signal terminal CLKB of the GOA unit 12 of the $(N-2)^{th}$ level and a first clock signal terminal CLK of the GOA unit 12 of the $N^{th}$ level are configured to receive a third clock signal CK3, a first clock signal terminal CLK of the GOA unit 12 of the $(N-1)^{th}$ level and a second clock signal terminal CLKB of a GOA unit 12 of a $(N+1)^{th}$ level are configured to receive a second clock signal CK2, a second clock signal terminal CLKB of the GOA unit 12 of the $(N-1)^{th}$ level and the first clock signal terminal CLK of the GOA unit 12 of the $(N+1)^{th}$ level are configured to receive a fourth clock signal CK4.

In an example, the reset terminal CLKRST of the GOA unit 12 of the $(N-2)^{th}$ level is configured to receive the fourth clock signal CK4, the reset terminal CLKRST of the GOA unit 12 of the $(N-1)^{th}$ level is configured to receive the first clock signal CK1, the reset terminal CLKRST of the GOA unit 12 of the $N^{th}$ level is configured to receive the second clock signal CK2, and the reset terminal CLKRST of the GOA unit 12 of the $(N+1)^{th}$ level is configured to receive the third clock signal CK3.

In some embodiments, the first clock signal CK1, the second clock signal CK2, the third clock signal CK3 and the fourth clock signal CK4 each have a duty cycle less than or equal to 25%.

Figure 6:
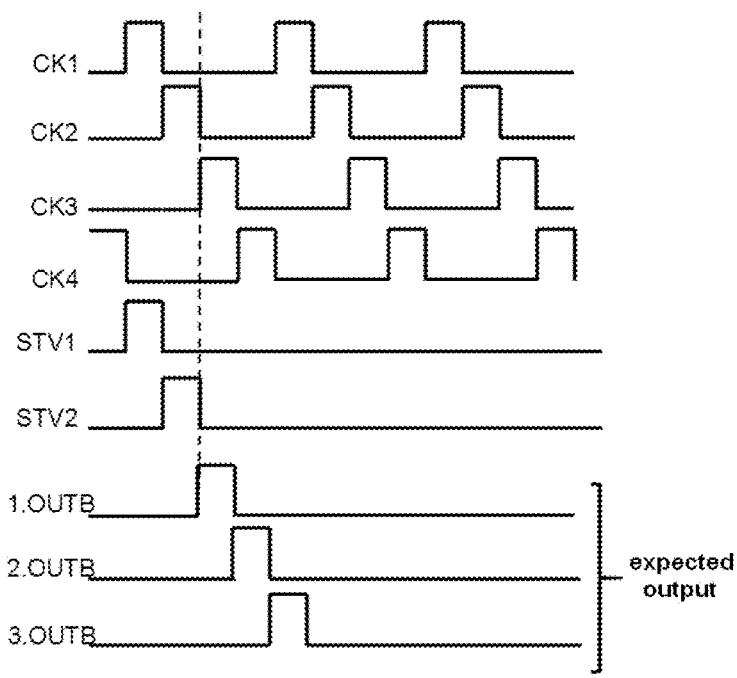
FIG. 6 is a timing sequence diagram of a GOA circuit according to an embodiment of the present disclosure.

Specifically, as shown in FIG. 6, the first clock signal CK1, the second clock signal CK2, the third clock signal CK3 and the fourth clock signal CK4 each have a duty cycle less than or equal to 25%. The first clock signal CK1, the second clock signal CK2, the third clock signal CK3 and the fourth clock signal CK4 each output high level signal in turn. In some embodiments, the fourth clock signal CK4 is configured to trigger the reset terminal CLKRST of the GOA unit 12 of the first level, and thus the fourth clock signal CK4 may first output a high level signal to complete the reset or initialization operation of the GOA unit 12 of the first level. The first starting signal STV1 and the second starting signal STV2 sequentially output a high level signal after the fourth clock signal CK4 to activate the GOA unit 12 of the first level and the GOA unit 12 of the second level. In this way, the desired output voltages of the second output terminals OUTBs of the GOA units 12 of the first level, the second level, and the third level as shown in FIG. 6 may be acquired.

The working principle of the GOA circuit 10 of the embodiments of the present disclosure will be described in stages below.

First Stage: An Initial Stage

Figure 7:
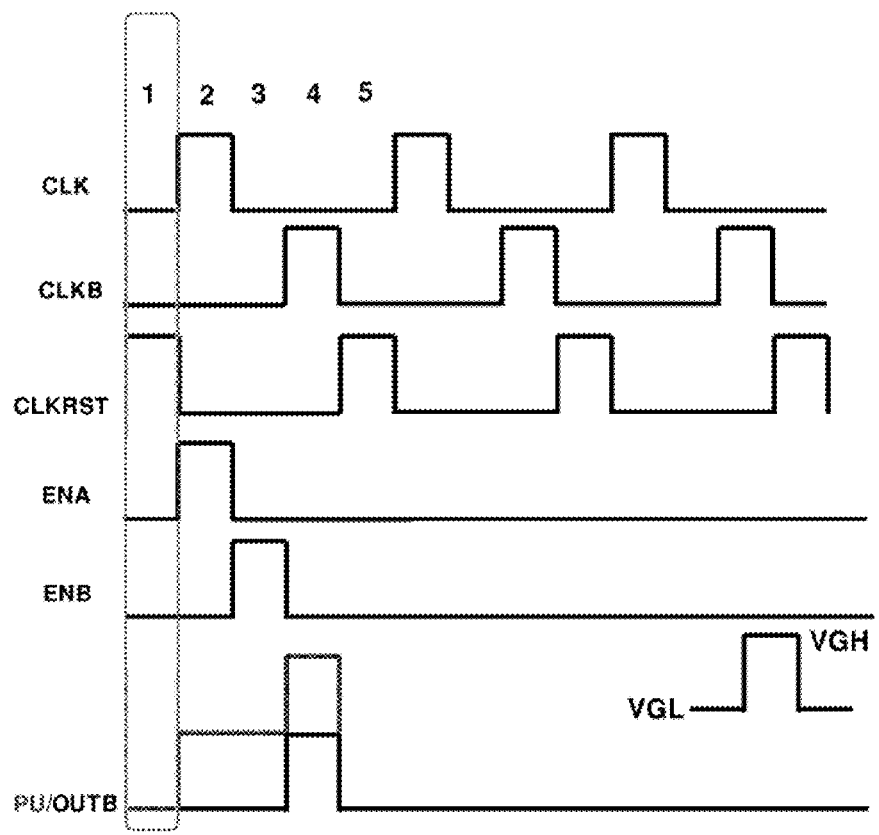
FIG. 7 is a schematic diagram of a working waveform of a first stage of a GOA unit according to an embodiment of the present disclosure.
Figure 8:
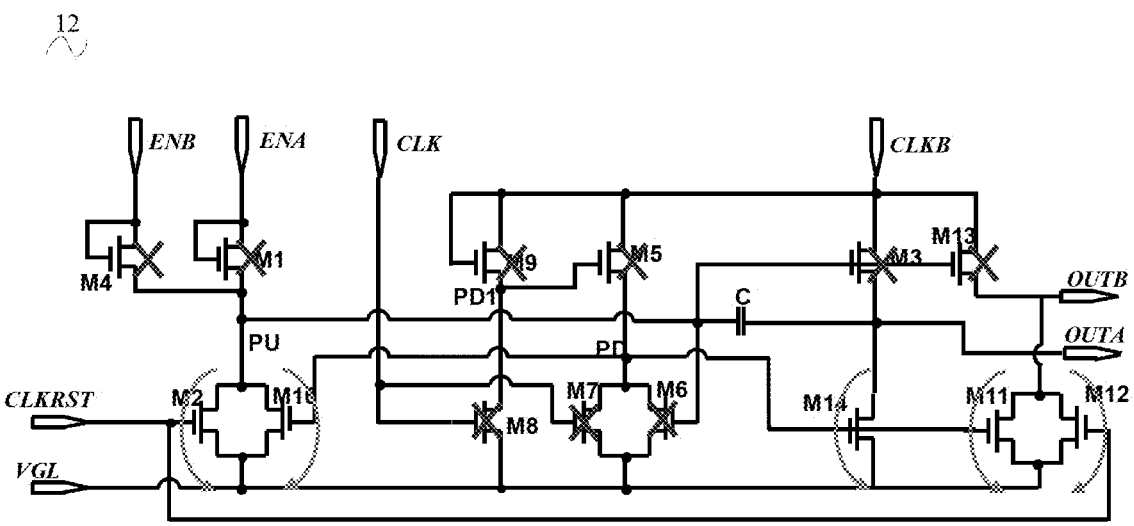
FIG. 8 is a diagram of a working principle of a first stage of a GOA unit according to an embodiment of the present disclosure.

With reference to FIGS. 7 and 8, all of the pull-up transistors are in an off state, and the reset terminal CLKRST, the second node PD1 and the third node PD are at a high potential. It should be understood that the pull-up transistor includes the first transistor M1, the third transistor M3, the fourth transistor M4, the fifth transistor M5, the sixth transistor M6, the seventh transistor M7, the eighth transistor M8, the ninth transistor M9 and the thirteenth Transistor M13.

The second transistor M2, the tenth transistor M10, the eleventh transistor M11, the twelfth transistor M12 and the fourteenth transistor M14 are turned on to discharge the residual charges on the first node PU and the node of the second output terminal OUTB and to clamp the voltages of the first node PU and the node of the second output terminal OUTB at the second preset voltage VGL.

Second Stage: A Pre-Charging Stage

Figure 9:
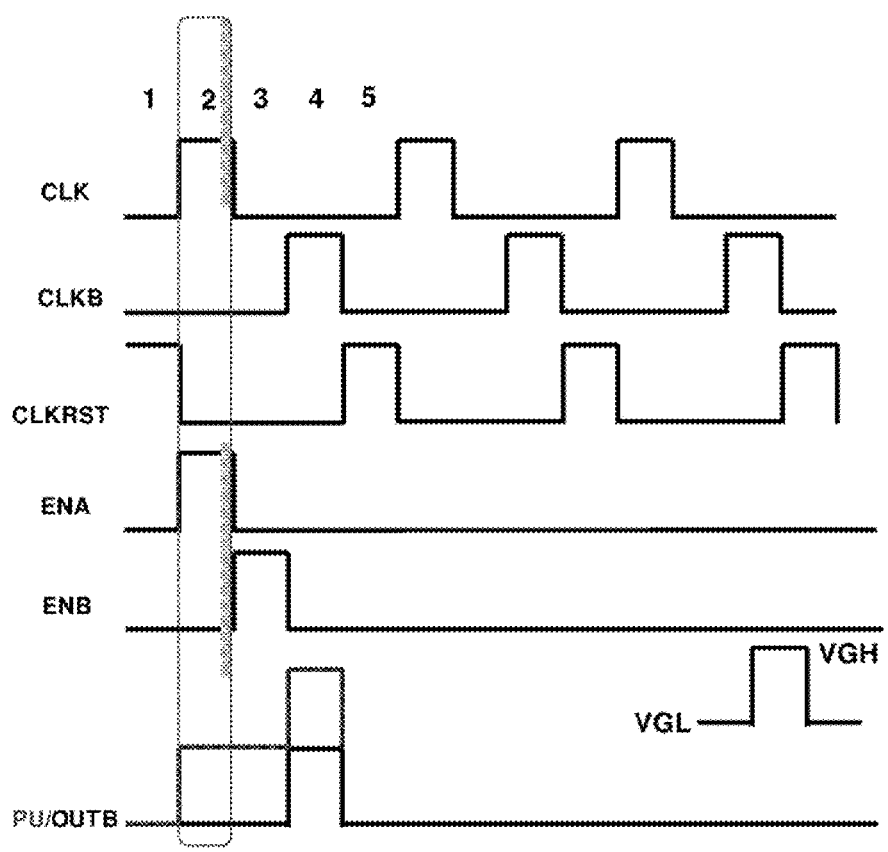
FIG. 9 is a schematic diagram of a working waveform of a second stage of a GOA unit according to an embodiment of the present disclosure.
Figure 10:
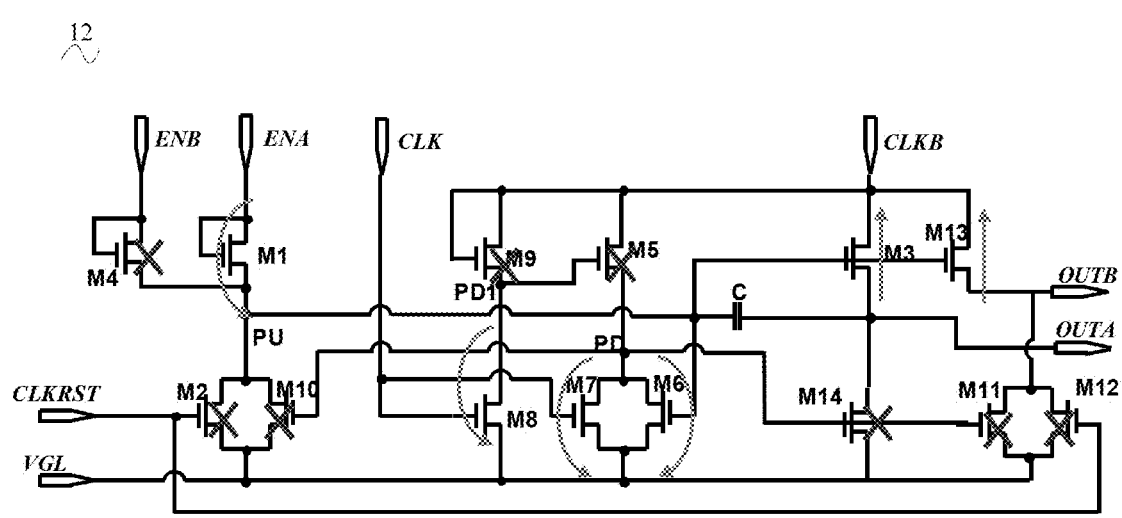
FIG. 10 is a diagram of a working principle of a second stage of a GOA unit according to an embodiment of the present disclosure.
Figure 11:
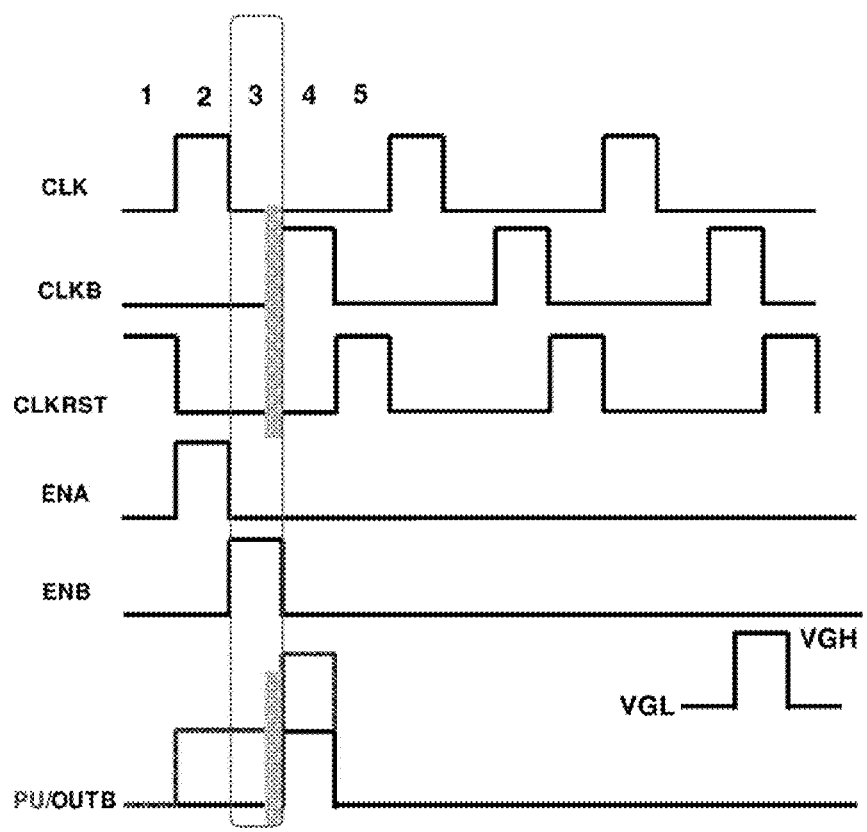
FIG. 11 is a schematic diagram of a working waveform of a third stage of a GOA unit according to an embodiment of the present disclosure.
Figure 12:
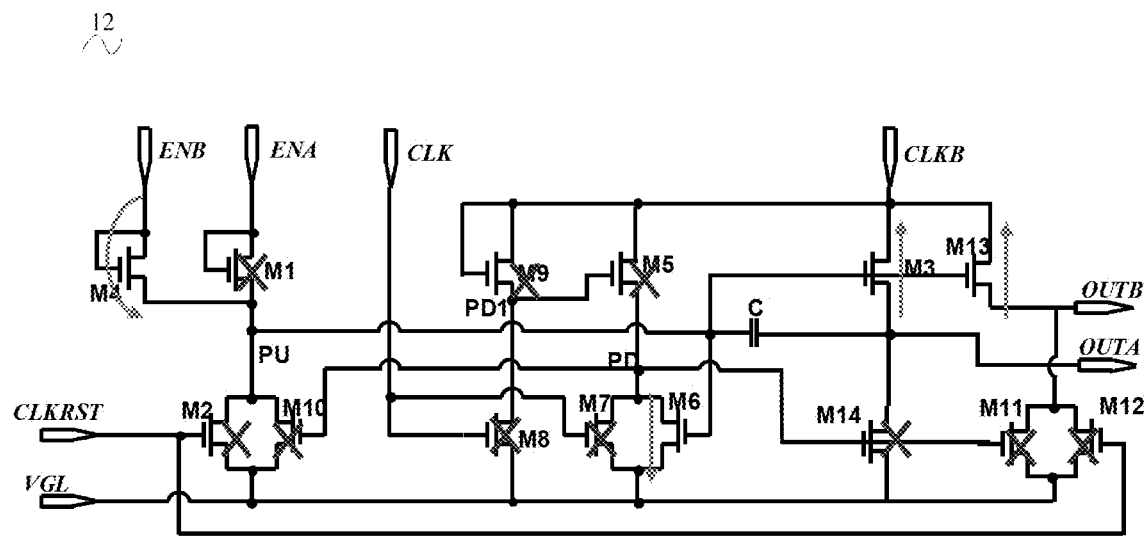
FIG. 12 is a diagram of a working principle of a third stage of a GOA unit according to an embodiment of the present disclosure.

With reference to FIGS. 9 and 10, the signal from the first enable input terminal ENA of the $(N-2)^{th}$ level rises, and the first node PU is pre-charged by the first transistor M1 to the first preset voltage VGH. Voltages of the first clock signal terminal CLK and the first node PU rise simultaneously. The sixth transistor M6, the seventh transistor M7 and the eighth transistor M8 are turned on to discharge the second node PD1 and the third node PD. The voltage of the third node PD is decreased, and the tenth transistor M10, the eleventh transistor M11 and the fourteenth transistor M14 are turned off. The signal of the reset terminal CLKRST falls, and the second transistor M2 and the twelfth transistor M12 are turned off Third Stage: A Holding Stage With reference to FIGS. 11 and 12, the signal from the first enable input terminal ENA of the $(N-2)^{th}$ level falls, and the first transistor M1 is turned off. The signal from the second enable input terminal ENB of the $(N-1)^{th}$ level rises, and the fourth transistor M4 is turned on. The fourth transistor M4 subsequently charges the first node PU and holds the voltage of the first node PU at the first preset voltage VGH. The signal of the first clock signal terminal CLK falls, and the seventh transistor M7 and the eighth transistor M8 are turned off.

In this way, even if the first node PU is discharged after being pre-charged, the fourth transistor M4 may be able to boost the voltage of the first node PU back in the holding stage, thus effectively reducing the risk caused by electric leakage.

Fourth Stage: A Bootstrap Output Stage

Figure 13:
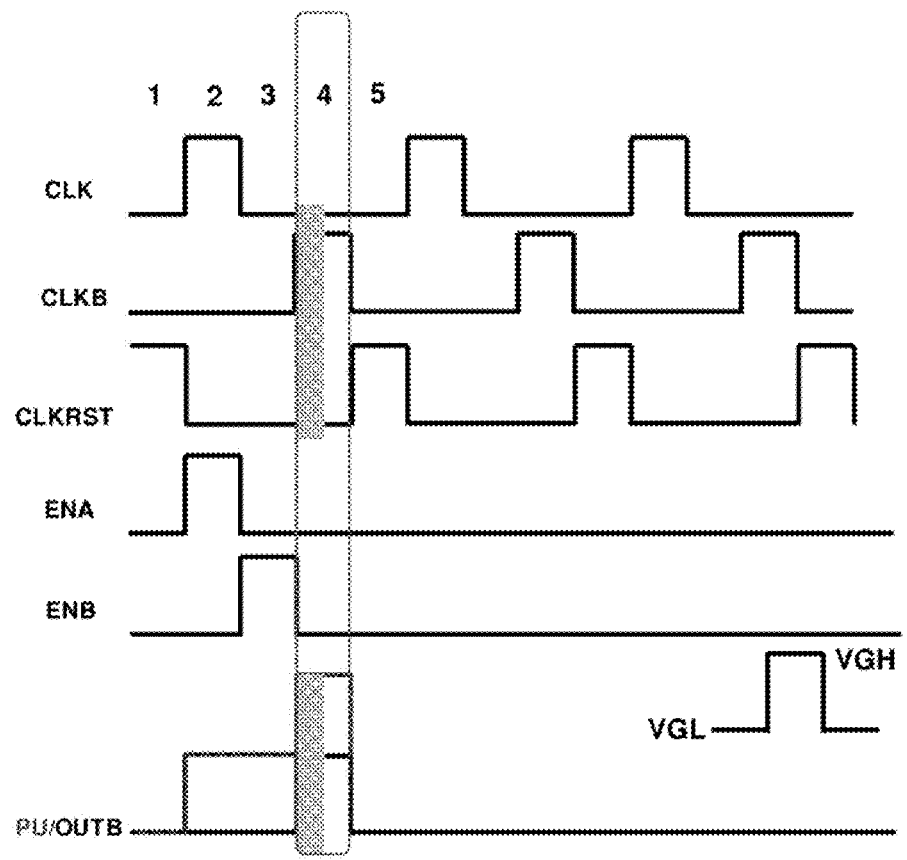
FIG. 13 is a schematic diagram of a working waveform of a fourth stage of a GOA unit according to an embodiment of the present disclosure.
Figure 14:
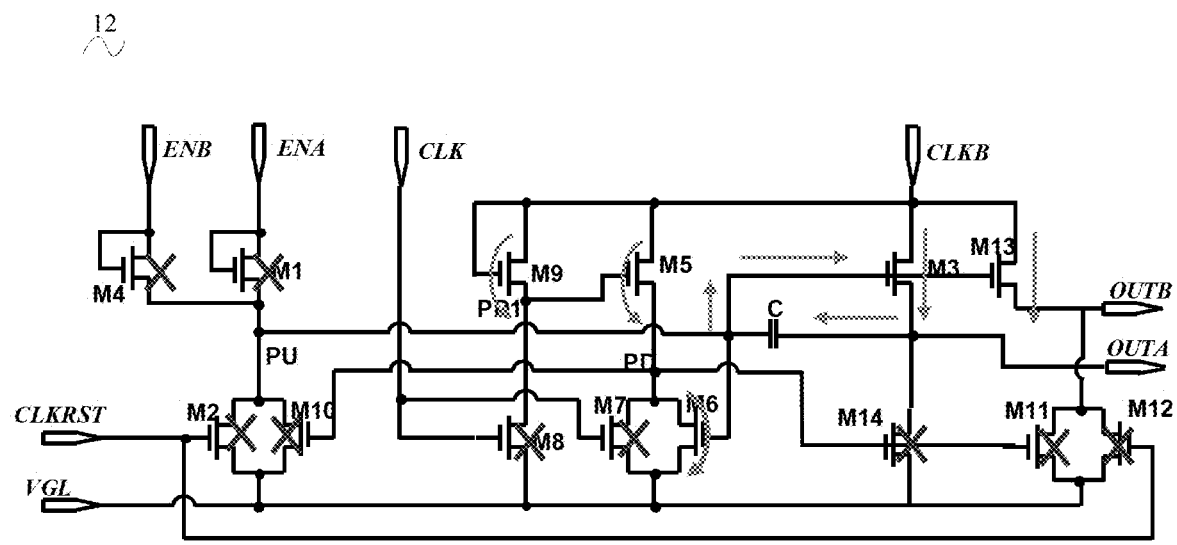
FIG. 14 is a diagram of a working principle of a fourth stage of a GOA unit according to an embodiment of the present disclosure.

With reference to FIGS. 13 and 14, a pulse of the second clock signal terminal CLKB occurs, and nodes of the first output terminal OUTA and the second output terminal OUTB are charged via the third transistor M3 and the thirteenth transistor M13 that have already been turned on. The voltage of the node of the first output terminal OUTA rises, and the gate voltage of the third transistor M3 may be further increased by the bootstrap capacitor C. In this way, More current may flow through the third transistor M3, resulting in a further increase in the voltage at the node of the first output terminal OUTA. Such an increase process continues until the voltage of the node of the first output terminal OUTA reaches the first preset voltage VGH. At this time, the voltage of the first node PU will reach (2VGH−VGL), thus ensuring that the gate voltage of the third transistor M3 is greater than the threshold voltage.

Due to the rapid rise of the voltage of the first node PU, a channel resistance of the thirteenth transistor M13 rapidly drops, and the scanning pulse signal is output to the current row of pixels by the second output terminal OUTB.

During this process, the fifth transistor M5 and the ninth transistor M9 may charge the third node PD to try to increase the voltage of the third node PD. However, due to a delay of the ninth transistor M9, the fifth transistor M5 may have a lag opening. Further, the first node PU has already been in a region of the first preset voltage VGH, such that the sixth transistor M6 may be turned on before the fifth transistor M5. The voltage of the third node PD will be maintained at the second preset voltage VGL by the wider, stronger sixth transistor M6. Therefore, the tenth transistor M10, the eleventh transistor M11 and the fourteenth transistor M14 remain turned off, and the above bootstrap output process will not be affected.

Fifth Stage: A Reset Stage

Figure 15:
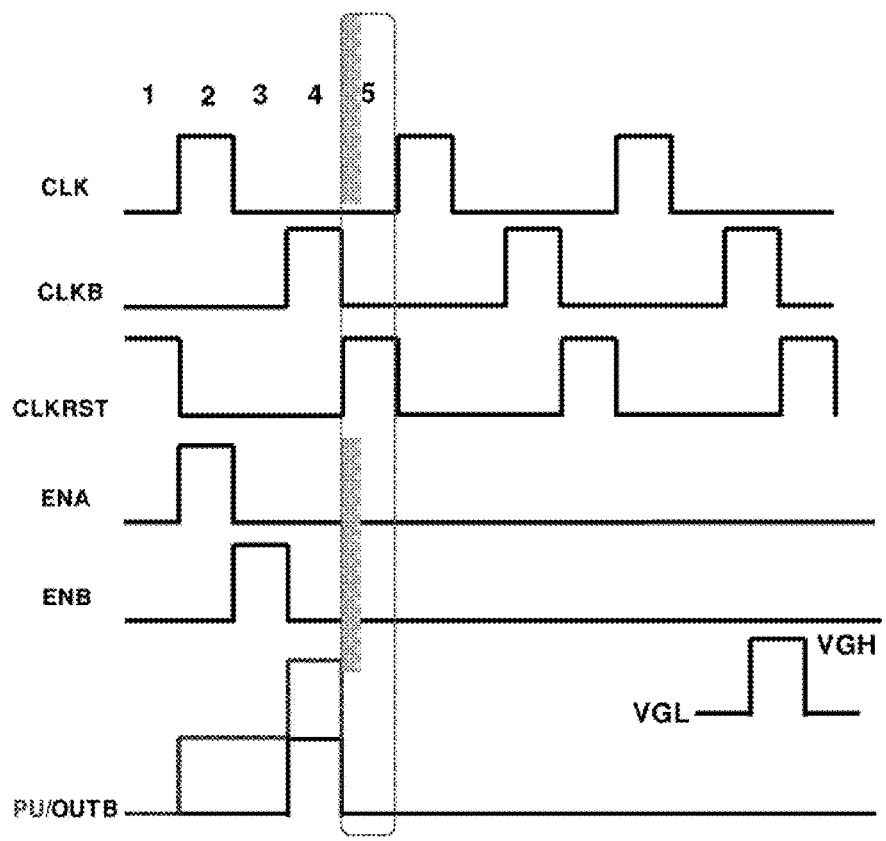
FIG. 15 is a schematic diagram of a working waveform of a fifth stage of a GOA unit according to an embodiment of the present disclosure.
Figure 16:
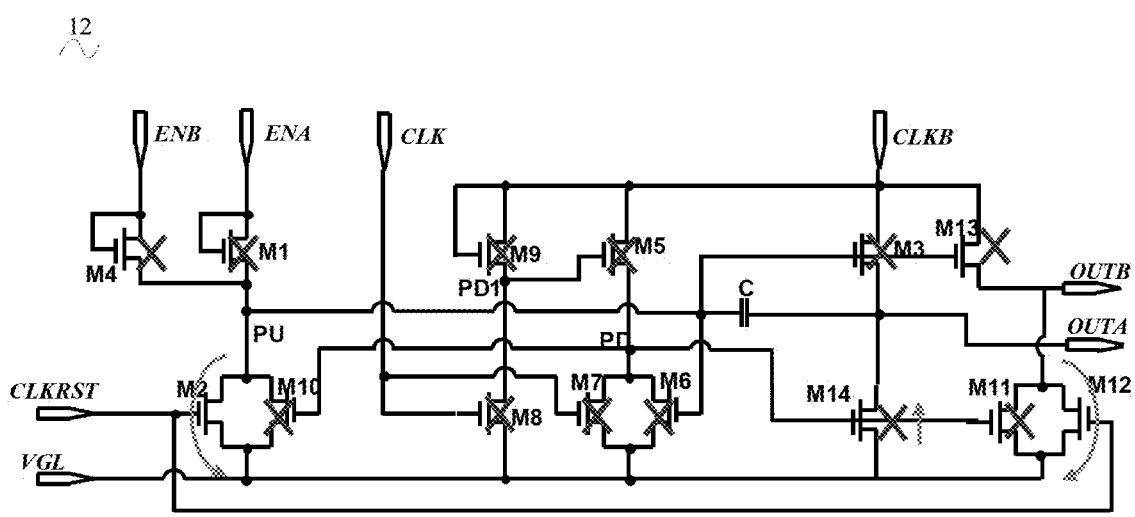
FIG. 16 is a diagram of a working principle of a fifth stage of a GOA unit according to an embodiment of the present disclosure.

With reference to FIGS. 15 and 16, the second transistor M2 and the twelfth transistor M12 are turned on by a pulse of the reset terminal CLKRST. The two transistors effectively discharge the first node PU and the node of the second output terminal OUTB, and thus the voltages of the first node PU and the node of the second output terminal OUTB are decreased to the second preset voltage VGL.

The voltage of the node of the first output terminal OUTA may be decreased with the decrease of the voltage of the first node PU since the voltage difference across the bootstrap capacitor C is not enough to be stepped. When the voltage of the first node PU is decreased from (2VGH−VGL) to VGL, the voltage of the node of the first output terminal OUTA has a tendency to fall below the second preset voltage VGL. However, once the voltage of the node of the first output terminal OUTA is lower than (VGL−Vth), the fourteenth transistor M14 is turned on to charge the node of the first output terminal OUTA. Therefore, the voltage of the node of the first output terminal OUTA is between VGL and (VGL−Vth), in which Vth is the threshold voltage.

Sixth Stage: A Pulse Stage of a Subsequent First Clock Signal Terminal CLK

Figure 17:
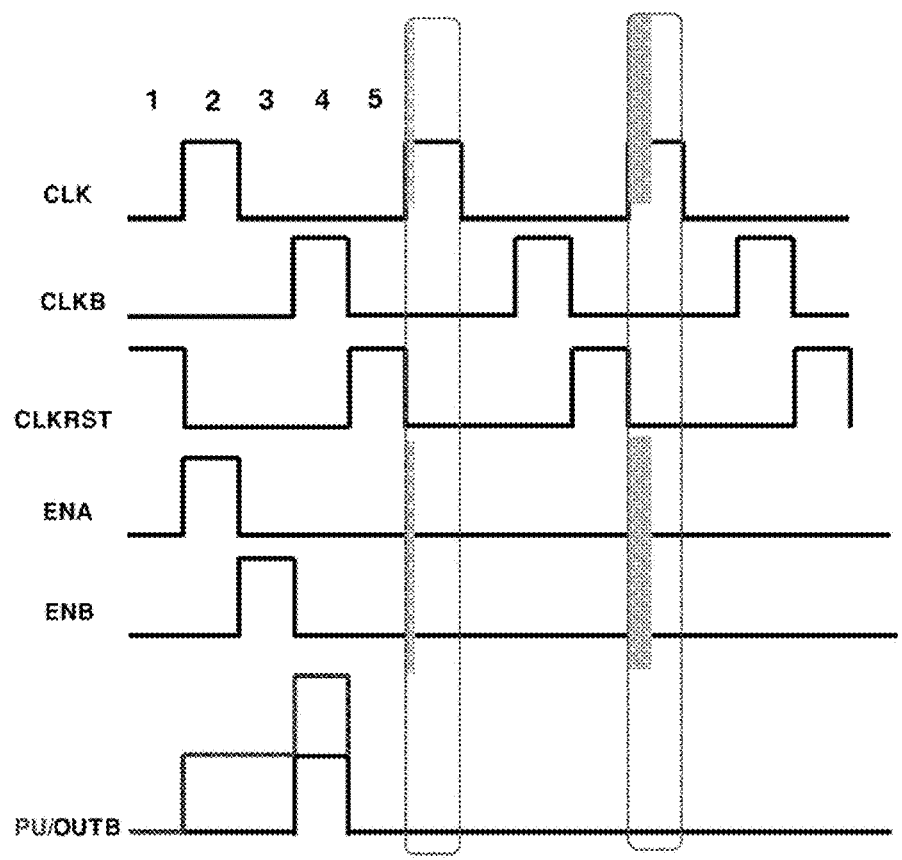
FIG. 17 is a schematic diagram of a working waveform of a sixth stage of a GOA unit according to an embodiment of the present disclosure.
Figure 18:
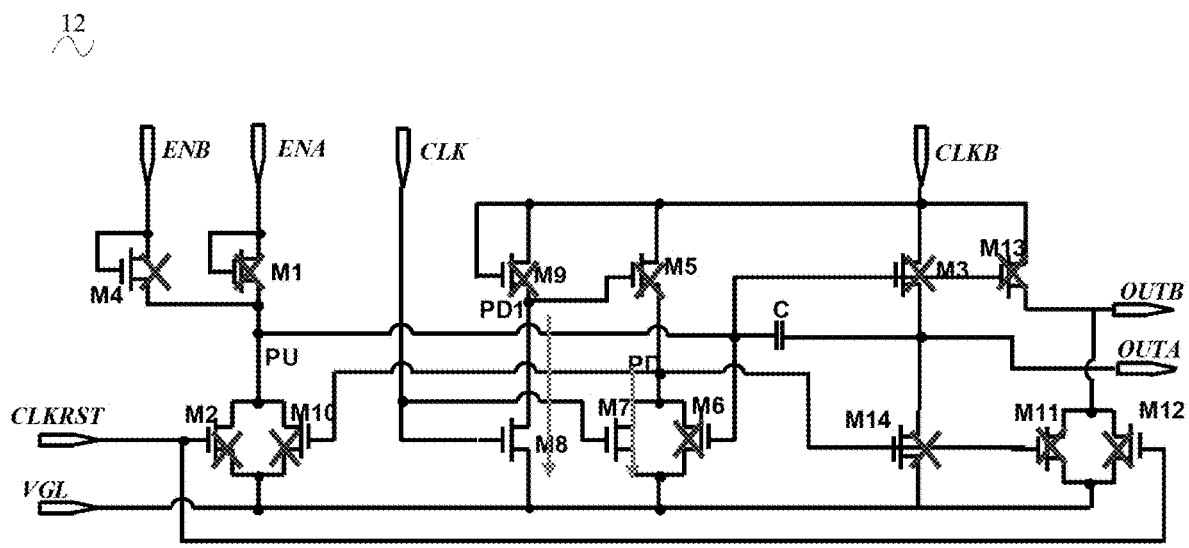
FIG. 18 is a diagram of a working principle of a sixth stage of a GOA unit according to an embodiment of the present disclosure.

With reference to FIGS. 17 and 18, the seventh transistor M7 and the eighth transistor M8 are turned on, and the voltages of the second node PD1 and the third node PD are discharged to the second preset voltage VGL. The tenth transistor M10, the eleventh transistor M11 and the fourteenth transistor M14 are turned off.

It can be understood that after the fifth stage, the sixth stage, the seventh stage and the eighth stage will be continuously and alternately performed, and repeated in cycle, i.e., the fifth stage, the sixth stage, the seventh stage, the eighth stage, the sixth stage, the seventh stage, the eighth stage, the sixth stage, the seventh stage, the eighth stage, the sixth stage, the seventh stage, the eighth stage . . . . Therefore, the first sixth stage is performed after the fifth stage, the other sixth stages are performed after the eighth stage. In the seventh stage, the tenth transistor M10, the eleventh transistor M11 and the fourteenth transistor M14 are turned on. In the eighth stage, the three transistors are kept on. Therefore, when the eighth stage ends and the sixth stage starts, the above three transistors are turned on.

Seventh Stage: A Pulse Stage of a Subsequent Second Clock Signal Terminal CLKB

Figure 19:
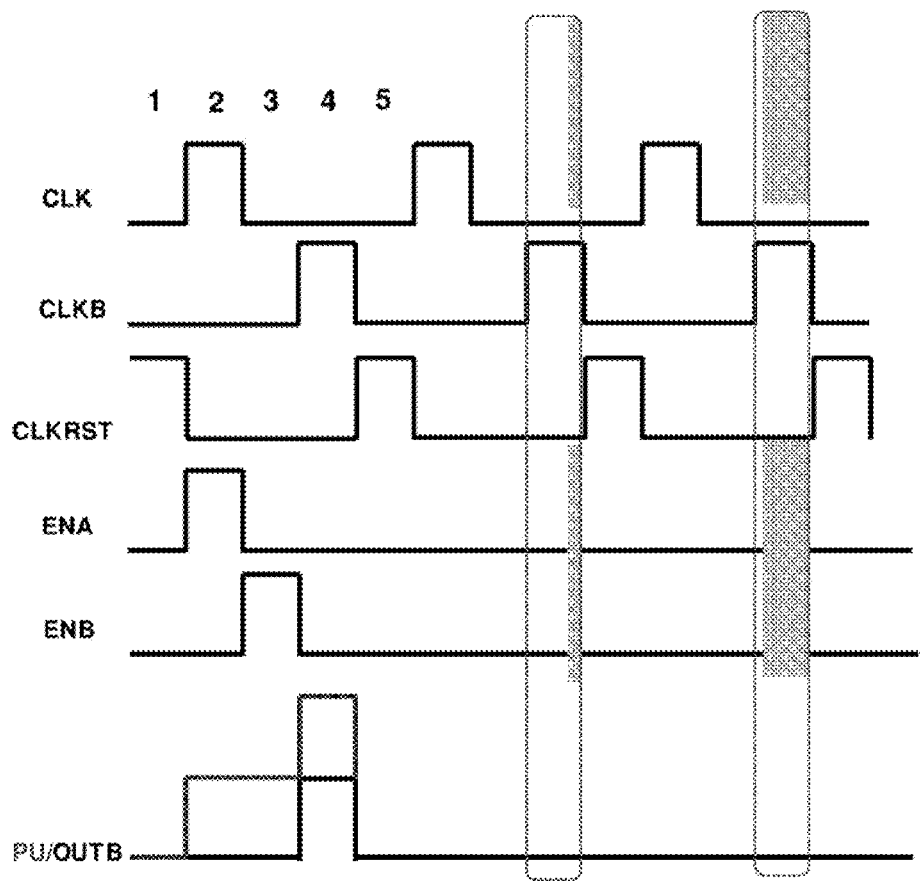
FIG. 19 is a schematic diagram of a working waveform of a seventh stage of a GOA unit according to an embodiment of the present disclosure.
Figure 20:
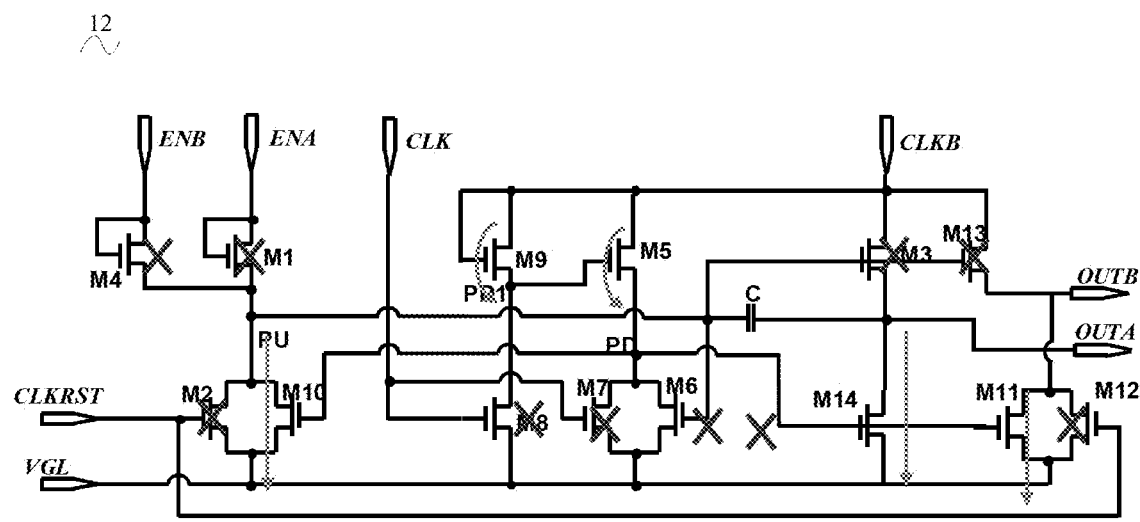
FIG. 20 is a diagram of a working principle of a seventh stage of a GOA unit according to an embodiment of the present disclosure.

With reference to FIGS. 19 and 20, the fifth transistor M5 and the ninth transistor M9 charge the second node PD1 and the third node PD at the first preset voltage VGH. The tenth transistor M10, the eleventh transistor M11 and the fourteenth transistor M14 are turned on by the third node PD. The voltages of the first node PU, the node of the first output terminal OUTA and the node of the second output terminal OUTB are clamped to the second preset voltage VGL by the tenth transistor M10, the fourteenth transistor M14 and the eleventh transistor M11, respectively.

Eighth Stage: A Pulse Stage of a Subsequent Reset Terminal CLKRST

Figure 21:
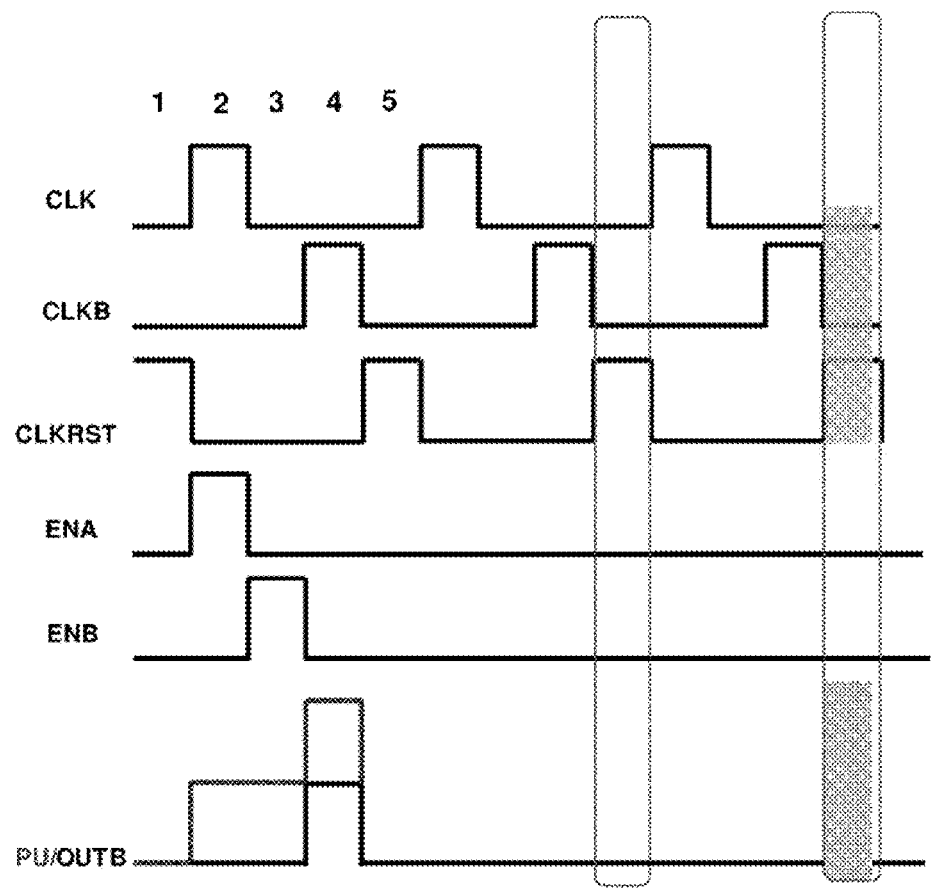
FIG. 21 is a schematic diagram of a working waveform of an eighth stage of a GOA unit according to an embodiment of the present disclosure.
Figure 22:
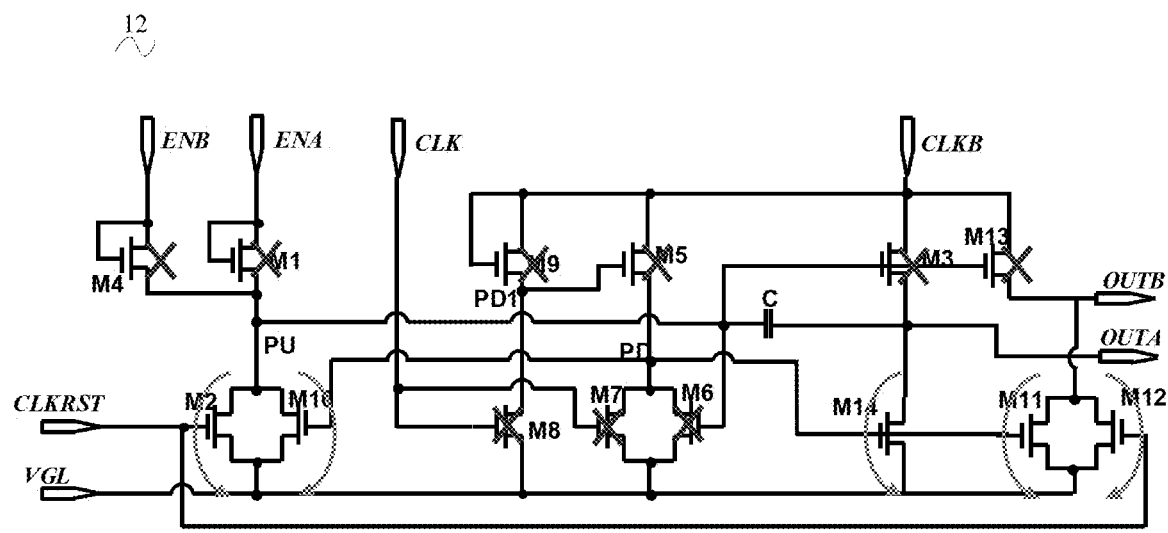
FIG. 22 is a diagram of a working principle of an eighth stage of a GOA unit according to an embodiment of the present disclosure.

With reference to FIGS. 21 and 22, the second transistor M2 and the twelfth transistor M12 are turned on. The voltage of the third node PD is maintained at the first preset voltage VGH, and the tenth transistor M10, the fourteenth transistor M14, and the eleventh transistor M11 continue to be turned on. The voltages of the first node PU, the node of the first output terminal OUTA, and the node of the second output terminal OUTB are clamped at the second preset voltage VGL.

In this way, the sixth stage, the seventh stage and the eight stage are repeated in cycle. The voltages of the first node PU, the node of the first output terminal OUTA and the node of the second output terminal OUTB are clamped at the second preset voltage VGL.

It may be returned to the first stage once a next frame of the scanning signal is output.

It will be appreciated that the timing sequence diagram of the GOA circuit 10 as shown in FIG. 6 follows the working principle of the GOA unit 12 of the single level of the embodiments of the present disclosure.

Figure 23:
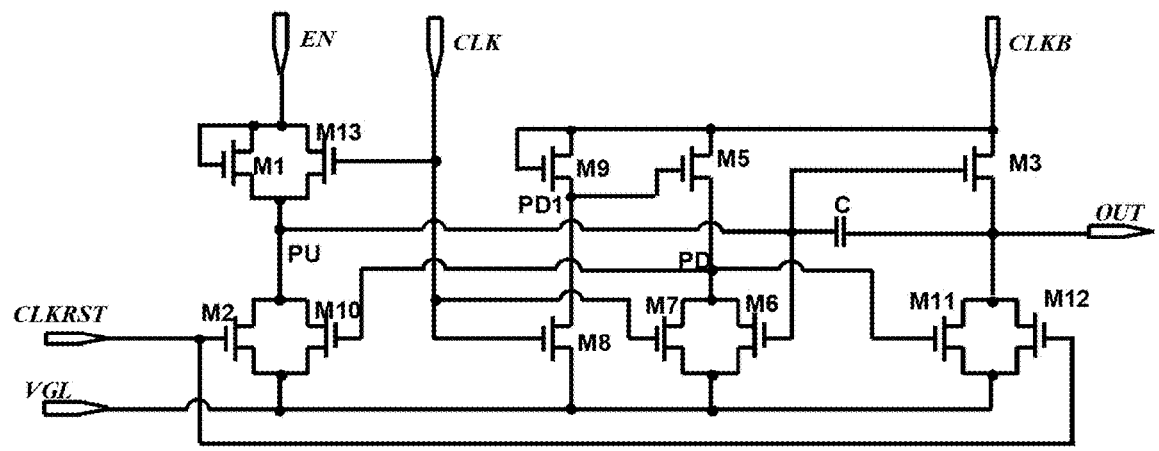
FIG. 23 is a schematic diagram of a conventional GOA unit.
Figure 24:
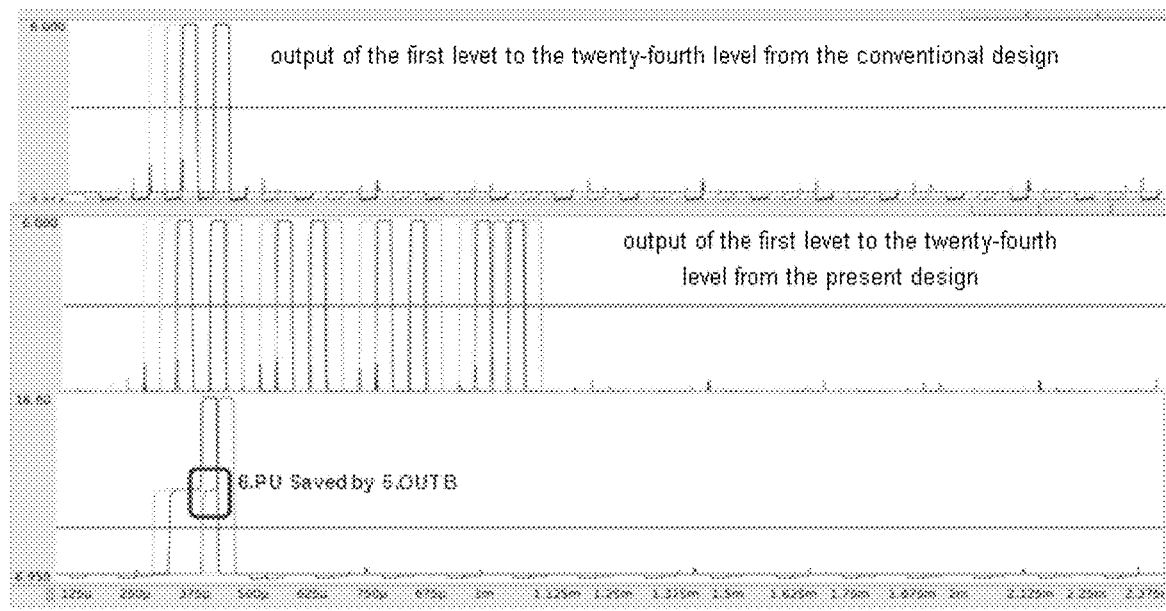
FIG. 24 is a diagram illustrating comparison of working waveforms of a conventional GOA unit and a GOA circuit of an embodiment of the present disclosure when an output failure occurs in a single level.

With reference to FIGS. 23 and 24, when an output failure occurs in some GOA units of the conventional GOA circuit, such a failure will be transmitted in the GOA link, resulting in output failures in all the subsequent levels. In the GOA circuit 10 of the embodiments of the present disclosure, as long as failures do no occur in the GOA units 12 of the two adjacent levels at the same time, the GOA circuit 10 can still resume working in the subsequent levels. Moreover, the number of the level where the output failure occurs can be easily determined, thus facilitating failure analysis.

Compared with the conventional GOA circuit, changes in the GOA circuit 10 according to the embodiments of the present disclosure only relate to an addition of one transistor (i.e., the fourth transistor M4) and a few wiring changes, thus having a small circuit area.

Figure 25:
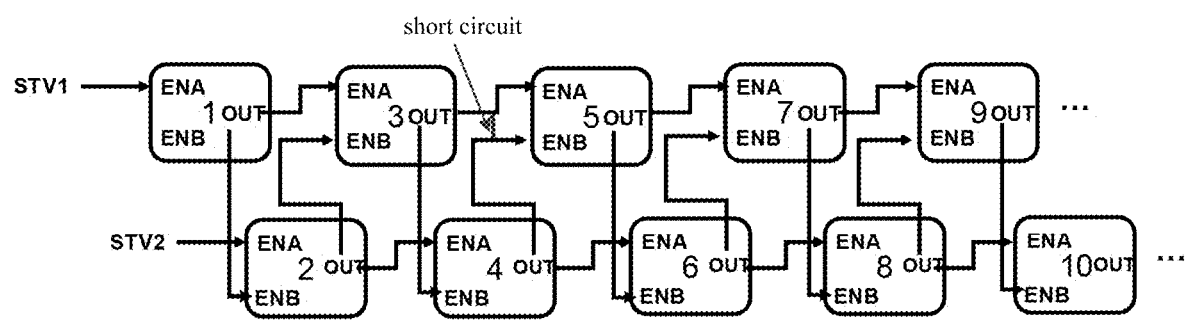
FIG. 25 is a circuit diagram of a GOA circuit according to an embodiment of the present disclosure when a short circuit occurs in GOA units of two adjacent levels.
Figure 26:
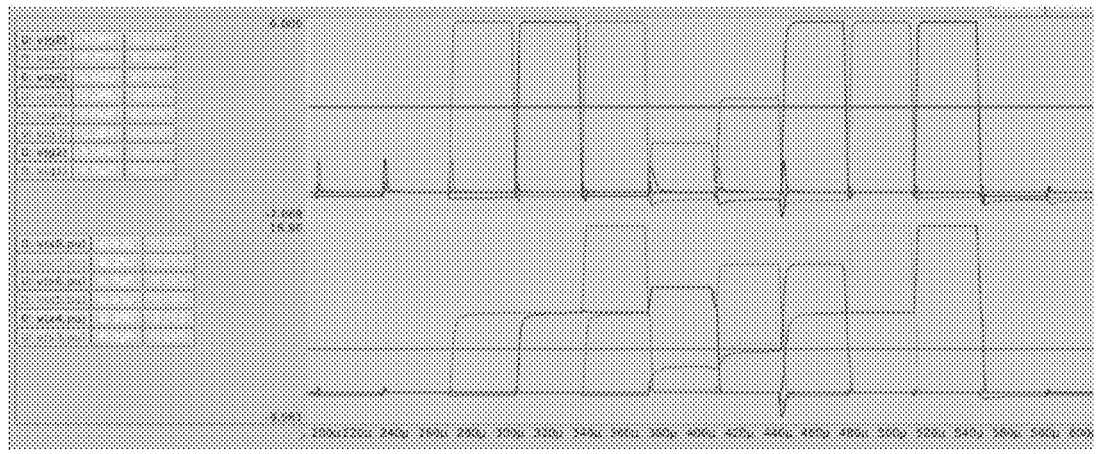
FIG. 26 is a schematic diagram of a working waveform of a GOA circuit according to an embodiment of the present disclosure when a short circuit occurs in GOA units of two adjacent levels.

With reference to FIGS. 25 and 26, for example, when a short circuit occurs between the GOA unit 12 of the fourth level and the GOA unit 12 of the fifth level, or the first enable input terminal ENA of the GOA unit 12 of the fifth level is shorted to the second enable input terminal ENB, the heights of the pulses output by the GOA unit 12 of the fourth level and the GOA unit 12 of the fifth level are both lowered, but the output waveform of the subsequent circuit level can be recovered to normal.

Reference throughout this specification to "an embodiment", "some embodiments", "a schematic embodiment", "an example", "a specific example" or "some examples"

means that a particular feature, structure, material, or characteristic described in connection with the embodiment or example is included in at least one embodiment or example of the present disclosure. Thus, the appearances of the phrases such as "an embodiment", "some embodiments", "a schematic embodiment", "an example", "a specific example" or "some examples" in various places throughout this specification are not necessarily referring to the same embodiment or example of the present disclosure. Furthermore, the particular features, structures, materials, or characteristics may be combined in any suitable manner in one or more embodiments or examples.

It will be understood that, any process or method described in a flow chart or described herein in other manners may include one or more modules, segments or portions of codes that include executable instructions to implement the specified logic function(s) or that includes executable instructions of the steps of the progress. Although the flow chart shows a specific order of execution, it is understood that the order of execution may differ from that which is depicted. For example, the order of execution of two or more boxes may be scrambled relative to the order shown. Also, two or more boxes shown in succession in the flow chart may be executed concurrently or with partial concurrence.

The logic and/or step described in other manners herein or shown in the flow chart, for example, a particular sequence table of executable instructions for realizing the logical function, may be specifically achieved in any computer readable medium to be used by the instruction execution system, device or equipment (such as the system based on computers, the system including processors or other systems capable of obtaining the instruction from the instruction execution system, device and equipment and executing the instruction), or to be used in combination with the instruction execution system, device and equipment. As to the specification, the "computer readable medium" may be any device adaptive for including, storing, communicating, propagating or transferring programs to be used by or in combination with the instruction execution system, device or equipment. More specific examples of the computer readable medium include but are not limited to: an electronic connection (an IPM overcurrent protection circuit) with one or more wires, a portable computer enclosure (a magnetic device), a random access memory (RAM), a read only memory (ROM), an erasable programmable read-only memory (EPROM or a flash memory), an optical fiber device and a portable compact disk read-only memory (CDROM). In addition, the computer readable medium may even be a paper or other appropriate medium capable of printing programs thereon, this is because, for example, the paper or other appropriate medium may be optically scanned and then edited, decrypted or processed with other appropriate methods when necessary to obtain the programs in an electric manner, and then the programs may be stored in the computer memories.

It should be understood that each part of the present disclosure may be realized by the hardware, software, firmware or their combination. In the above embodiments, a plurality of steps or methods may be realized by the software or firmware stored in the memory and executed by the appropriate instruction execution system. For example, if it is realized by the hardware, likewise in another embodiment, the steps or methods may be realized by one or a combination of the following techniques known in the art: a discrete logic circuit having a logic gate circuit for realizing a logic function of a data signal, an application-specific integrated circuit having an appropriate combination logic gate circuit, a programmable gate array (PGA), a field programmable gate array (FPGA), etc.

Those skilled in the art shall understand that all or parts of the steps in the above exemplifying method of the present disclosure may be achieved by commanding the related hardware with programs. The programs may be stored in a computer readable storage medium, and the programs include one or a combination of the steps in the method embodiments of the present disclosure when run on a computer.

In addition, each function cell of the embodiments of the present disclosure may be integrated in a processing module, or these cells may be separate physical existence, or two or more cells are integrated in a processing module. The integrated module may be realized in a form of hardware or in a form of software function modules. When the integrated module is realized in a form of software function module and is sold or used as a standalone product, the integrated module may be stored in a computer readable storage medium.

The storage medium mentioned above may be read-only memories, magnetic disks, CD, etc.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A gate driver on array (GOA) circuit, configured to provide a scanning pulse signal to a pixel matrix, comprising a plurality of GOA units in cascade, wherein
the GOA unit comprises a first enable input terminal, a second enable input terminal, a first output terminal, a second output terminal and a first node,
a first output terminal of a GOA unit of a $(N-2)^{th}$ level is coupled to a first enable input terminal of a GOA unit of a $N^{th}$ level, a second output terminal of the GOA unit of the $(N-2)^{th}$ level is coupled to a second enable input terminal of a GOA unit of a $(N-1)^{th}$ level, wherein N is a natural number greater than 2, the second output terminal is configured to output the scanning pulse signal to the pixel matrix; and
the GOA unit further comprises a pull-up holding unit configured to couple the second enable input terminal to the first node and charge the first node to hold a voltage of the first node at a first preset voltage;
wherein the pull-up holding unit comprises a fourth transistor, a gate and a source of the fourth transistor are coupled to the second enable input terminal, and a drain of the fourth transistor is coupled to the first node.

2. The GOA circuit according to claim 1, wherein the pixel matrix comprises a plurality of rows of pixels, and a second output terminal of a GOA unit of a current level is configured to output the scanning pulse signal to a corresponding row of pixels in the pixel matrix, and the corresponding row of pixels are coupled to a second enable input terminal of a GOA unit of a subsequent level.

3. The GOA circuit according to claim 1, wherein GOA units of two adjacent levels are disposed at two sides of the pixel matrix, respectively.

4. The GOA circuit according to claim 1, wherein the GOA unit comprises a pull-down unit, a pull-up controlling unit, a bootstrap capacitor, a pull-up unit, a second node and a third node, a first clock signal terminal, a second clock signal terminal, a reset terminal and a low level terminal, wherein
   the pull-down unit is coupled to the first node, the reset terminal and the low level terminal, and configured to discharge the first node to clamp the voltage of the first node at a second preset voltage smaller than the first present voltage;
   the pull-up controlling unit is coupled to the first enable input terminal and the first node, and configured to charge the first node to increase the voltage of the first node to the first preset voltage;
   one terminal of the bootstrap capacitor is coupled to the first node and the other terminal of the bootstrap capacitor is coupled to the first output terminal; and
   the pull-up unit is coupled to the first clock signal terminal, the second clock signal terminal, the first node, the low level terminal, the first output terminal and the second output terminal, and configured to discharge the second node and the third node to turn off the pull-down unit.

5. The GOA circuit according to claim 4, wherein the pull-down unit comprises a second transistor, a tenth transistor, an eleventh transistor, a twelfth transistor, a fourteenth transistor, wherein
   a gate of the second transistor is coupled to the reset terminal, a source of the second transistor is coupled to the first node, and a drain of the second transistor is coupled to the low level terminal;
   a gate of the tenth transistor is coupled to the third node, a source of the tenth transistor is coupled to the first node, and a drain of the tenth transistor is coupled to the low level terminal;
   a gate of the eleventh transistor is coupled to the third node, a source of the eleventh transistor is coupled to the second output terminal, and a drain of the eleventh transistor is coupled to the low level terminal;
   a gate of the twelfth transistor is coupled to the reset terminal, a source of the twelfth transistor is coupled to the second output terminal, and a drain of the twelfth transistor is coupled to the low level terminal; and
   a gate of the fourteenth transistor is coupled to the third node, a source of the fourteenth transistor is coupled to the first output terminal, and a drain of the fourteenth transistor is coupled to the low level terminal.

6. The GOA circuit according to claim 4, wherein the pull-up controlling unit comprises a first transistor, a gate and a source of the first transistor are coupled to the first enable input terminal, and a drain of the first transistor is coupled to the first node.

7. The GOA circuit according to claim 4, wherein the pull-up unit comprises a third transistor, a fifth transistor, a sixth transistor, a seventh transistor, an eighth transistor, a ninth transistor and a thirteenth transistor, wherein
   a gate of the third transistor is coupled to the first node, a source of the third transistor is coupled to the second clock signal terminal, and a drain of the third transistor is coupled to the first output terminal;
   a gate of the fifth transistor is coupled to the second node, a source of the fifth transistor is coupled to the second clock signal terminal, and a drain of the fifth transistor is coupled to the third node;
   a gate of the sixth transistor is coupled to the first node, a source of the sixth transistor is coupled to the third node, and a drain of the sixth transistor is coupled to the low level terminal;
   a gate of the seventh transistor is coupled to the first clock signal terminal, a source of the seventh transistor is coupled to the third node, and a drain of the seventh transistor is coupled to the low level terminal;
   a gate of the eighth transistor is coupled to the first clock signal terminal, a source of the eighth transistor is coupled to the second node, and a drain of the eighth transistor is coupled to the low level terminal;
   a gate and a source of the ninth transistor are coupled to the second clock signal terminal, and a drain of the ninth transistor is coupled to the second node; and
   a gate of the thirteenth transistor is coupled to the first node, a source of the thirteenth transistor is coupled to the second clock signal terminal, and a drain of the thirteenth transistor is coupled to the second output terminal.

8. The GOA circuit according to claim 4, wherein a phase difference between the first clock signal terminal and the second clock signal terminal is half of a cycle.

9. The GOA circuit according to claim 4, wherein a first clock signal terminal of the GOA unit of the $(N-2)^{th}$ level and a second clock signal terminal of the GOA unit of the $N^{th}$ level are configured to receive the first clock signal, a second clock signal terminal of the GOA unit of the $(N-2)^{th}$ level and a first clock signal terminal of the GOA unit of the $N^{th}$ level are configured to receive a third clock signal, a first clock signal terminal of the GOA unit of the $(N-1)^{th}$ level and a second clock signal terminal of a GOA unit of a $(N+1)^{th}$ level are configured to receive a second clock signal, a second clock signal terminal of the GOA unit of the $(N-1)^{th}$ level and a first clock signal terminal of the GOA unit of the $(N+1)^{th}$ level are configured to receive a fourth clock signal.

10. The GOA circuit according to claim 9, wherein the first clock signal, the second clock signal, the third clock signal and the fourth clock signal each have a duty cycle less than or equal to 25%.

11. The GOA circuit according to claim 1, wherein a first enable input terminal of a GOA unit of a first level is configured to receive a first starting signal, and a first enable input terminal of a GOA unit of a second level is configured to receive a second starting signal, the first starting signal is configured to activate the GOA unit of the first level, and the second starting signal is configured to activate the GOA unit of the second level.

12. An array substrate, comprising:
   a pixel matrix; and
   a GOA circuit configured to provide a scanning pulse signal to a pixel matrix, comprising a plurality of GOA units in cascade, wherein
   the GOA unit comprises a first enable input terminal, a second enable input terminal, a first output terminal, a second output terminal and a first node,
   a first output terminal of a GOA unit of a $(N-2)^{th}$ level is coupled to a first enable input terminal of a GOA unit of a $N^{th}$ level, a second output terminal of the GOA unit of the $(N-2)^{th}$ level is coupled to a second enable input terminal of a GOA unit of a $(N-1)^{th}$ level, wherein N is a natural number greater than 2, the second output terminal is configured to output the scanning pulse signal to the pixel matrix; and
   the GOA unit further comprises a pull-up holding unit configured to couple the second enable input terminal to the first node and charge the first node to hold a voltage of the first node at a first preset voltage;
   wherein the pull-up holding unit comprises a fourth transistor, a gate and a source of the fourth transistor are coupled to the second enable input terminal, and a drain of the fourth transistor is coupled to the first node.

13. The array substrate according to claim 12, wherein the pixel matrix comprises a plurality of rows of pixels, and a second output terminal of a GOA unit of a current level is configured to output the scanning pulse signal to a corresponding row of pixels in the pixel matrix, and the corresponding row of pixels are coupled to a second enable input terminal of a GOA unit of a subsequent level.

14. The array substrate according to claim 12, wherein GOA units of two adjacent levels are disposed at two sides of the pixel matrix, respectively.

15. The array substrate according to claim 12, wherein the GOA unit comprises a pull-down unit, a pull-up controlling unit, a bootstrap capacitor, a pull-up unit, a second node and a third node, a first clock signal terminal, a second clock signal terminal, a reset terminal and a low level terminal, wherein the pull-down unit is coupled to the first node, the reset terminal and the low level terminal, and configured to discharge the first node to clamp the voltage of the first node at a second preset voltage smaller than the first present voltage;

the pull-up controlling unit is coupled to the first enable input terminal and the first node, and configured to charge the first node to increase the voltage of the first node to the first preset voltage;

one terminal of the bootstrap capacitor is coupled to the first node and the other terminal of the bootstrap capacitor is coupled to the first output terminal; and the pull-up unit is coupled to the first clock signal terminal, the second clock signal terminal, the first node, the low level terminal, the first output terminal and the second output terminal, and configured to discharge the second node and the third node to turn off the pull-down unit.

16. The array substrate according to claim 15, wherein the pull-down unit comprises a second transistor, a tenth transistor, an eleventh transistor, a twelfth transistor, a fourteenth transistor, wherein a gate of the second transistor is coupled to the reset terminal, a source of the second transistor is coupled to the first node, and a drain of the second transistor is coupled to the low level terminal;

a gate of the tenth transistor is coupled to the third node, a source of the tenth transistor is coupled to the first node, and a drain of the tenth transistor is coupled to the low level terminal;

a gate of the eleventh transistor is coupled to the third node, a source of the eleventh transistor is coupled to the second output terminal, and a drain of the eleventh transistor is coupled to the low level terminal;

a gate of the twelfth transistor is coupled to the reset terminal, a source of the twelfth transistor is coupled to the second output terminal, and a drain of the twelfth transistor is coupled to the low level terminal; and a gate of the fourteenth transistor is coupled to the third node, a source of the fourteenth transistor is coupled to the first output terminal, and a drain of the fourteenth transistor is coupled to the low level terminal.

17. The array substrate according to claim 15, wherein the pull-up controlling unit comprises a first transistor, a gate and a source of the first transistor are coupled to the first enable input terminal, and a drain of the first transistor is coupled to the first node.

18. A display device comprising an array substrate, wherein the array substrate comprises:

a pixel matrix; and a GOA circuit configured to provide a scanning pulse signal to a pixel matrix, comprising a plurality of GOA units in cascade, wherein the GOA unit comprises a first enable input terminal, a second enable input terminal, a first output terminal, a second output terminal and a first node, a first output terminal of a GOA unit of a $(N-2)^{th}$ level is coupled to a first enable input terminal of a GOA unit of a $N^{th}$ level, a second output terminal of the GOA unit of the $(N-2)^{th}$ level is coupled to a second enable input terminal of a GOA unit of a $(N-1)^{th}$ level, wherein N is a natural number greater than 2, the second output terminal is configured to output the scanning pulse signal to the pixel matrix; and the GOA unit further comprises a pull-up holding unit configured to couple the second enable input terminal to the first node and charge the first node to hold a voltage of the first node at a first preset voltage;

wherein the pull-up holding unit comprises a fourth transistor, a gate and a source of the fourth transistor are coupled to the second enable input terminal, and a drain of the fourth transistor is coupled to the first node.

19. The display device according to claim 18, wherein the pixel matrix comprises a plurality of rows of pixels, and a second output terminal of a GOA unit of a current level is configured to output the scanning pulse signal to a corresponding row of pixels in the pixel matrix, and the corresponding row of pixels are coupled to a second enable input terminal of a GOA unit of a subsequent level.

20. The display device according to claim 18, wherein GOA units of two adjacent levels are disposed at two sides of the pixel matrix, respectively.

* * * * *